(12) United States Patent
Miyata et al.

(10) Patent No.: US 7,769,190 B2
(45) Date of Patent: Aug. 3, 2010

(54) AUDIO SIGNAL PROCESSING CIRCUIT AND A DISPLAY DEVICE INCORPORATING THE SAME

(75) Inventors: Kazuhiko Miyata, Habikino (JP); Jun Koyama, Sagamihara (JP); Hiroyuki Miyake, Atsugi (JP); Kei Takahashi, Atsugi (JP)

(73) Assignees: Semiconductor Energy Laboratory Co., Ltd., Atsugi-shi, Kanagawa-ken; Sharp Kabushiki Kaisha, Abeno-ku, Osaka-shi (JP)

( * ) Notice: Subject to any disclaimer, the term of this patent is extended or adjusted under 35 U.S.C. 154(b) by 1309 days.

(21) Appl. No.: 10/821,848

(22) Filed: Apr. 12, 2004

(65) Prior Publication Data

US 2004/0201056 A1 Oct. 14, 2004

(30) Foreign Application Priority Data

Apr. 14, 2003 (JP) ............................. 2003-108629

(51) Int. Cl.
*H04R 3/00* (2006.01)

(52) U.S. Cl. ................. 381/111; 381/368; 330/307; 348/739

(58) Field of Classification Search ................. 381/311, 381/388, 28, 120, 150, 333; 257/288, 581, 257/359; 345/92, 55, 30; 330/177, 157, 330/1 R, 282, 250, 278, 129, 307; 361/734, 361/748, 749; 438/149, 381, 384; 348/739; 715/864
See application file for complete search history.

(56) References Cited

U.S. PATENT DOCUMENTS

| 5,219,765 | A | 6/1993 | Yoshida et al. |
|---|---|---|---|
| 5,643,804 | A | 7/1997 | Arai et al. |
| 5,650,834 | A * | 7/1997 | Nakagawa et al. .......... 349/139 |
| 5,877,533 | A | 3/1999 | Arai et al. |
| 6,300,927 | B1 | 10/2001 | Kubota et al. |
| 6,331,718 | B1 * | 12/2001 | Yamazaki et al. ............. 257/64 |
| 6,410,960 | B1 | 6/2002 | Arai et al. |
| 6,545,225 | B2 | 4/2003 | Copetti et al. |

(Continued)

FOREIGN PATENT DOCUMENTS

CN    1306307    8/2001

(Continued)

OTHER PUBLICATIONS

Office Action (Application No. CN 200410032980.X) dated Jun. 15, 2007.

(Continued)

*Primary Examiner*—Vivian Chin
*Assistant Examiner*—Con P Tran
(74) *Attorney, Agent, or Firm*—Eric J. Robinson; Robinson Intellectual Property Law Office, P.C.

(57) ABSTRACT

An audio signal processing circuit for processing an audio signal which is compact and small is provided. For the audio signal processing circuit of the invention, an input circuit, a feedback circuit, and a smoothing circuit are formed using a chip capacitor with small mounting space and a thin film resistor on an insulating substrate. Accordingly, the audio signal processing circuit that is small and further a display device incorporating the audio signal processing circuit are provided.

30 Claims, 14 Drawing Sheets

U.S. PATENT DOCUMENTS

| | | |
|---|---|---|
| 7,068,246 B2 | 6/2006 | Yamazaki et al. |
| 7,230,316 B2 | 6/2007 | Yamazaki et al. |
| 7,522,159 B2 | 4/2009 | Miyata et al. |
| 2001/0005241 A1 | 6/2001 | Yamate et al. |
| 2002/0135708 A1 | 9/2002 | Murden et al. |
| 2002/0153844 A1 | 10/2002 | Koyama |
| 2006/0132401 A1 | 6/2006 | Yamazaki et al. |

FOREIGN PATENT DOCUMENTS

| | | |
|---|---|---|
| EP | 1 164 641 | 12/2001 |
| JP | 04-051604 | 2/1992 |
| JP | 05-102881 | 4/1993 |
| JP | 06-181369 | 6/1994 |
| JP | 07-261191 | 10/1995 |
| JP | 11-142813 | 5/1999 |
| JP | 11-266546 | 9/1999 |
| JP | 11-326937 | 11/1999 |
| JP | 2002-072963 | 3/2002 |
| JP | 2003-069352 | 3/2003 |

OTHER PUBLICATIONS

European Search Report dated Jul. 22, 2004 for EP 04 00 8900.

"Advantage of Two STK Thick Films Used as Switching Power Supply", China Academic Journal Electronic Publishing House, Dec. 31, 1998, pp. 40-41.

Office Action (Application No. 200410032980.X) dated Dec. 28, 2007.

* cited by examiner

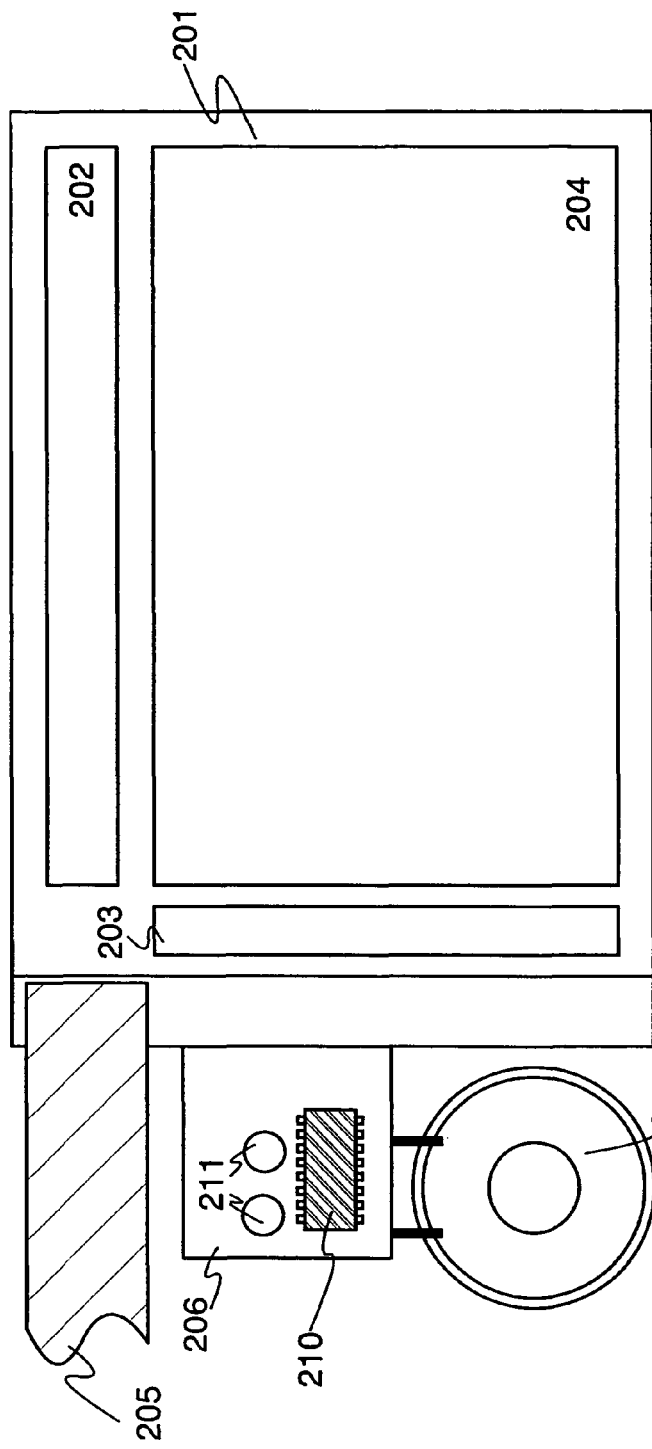
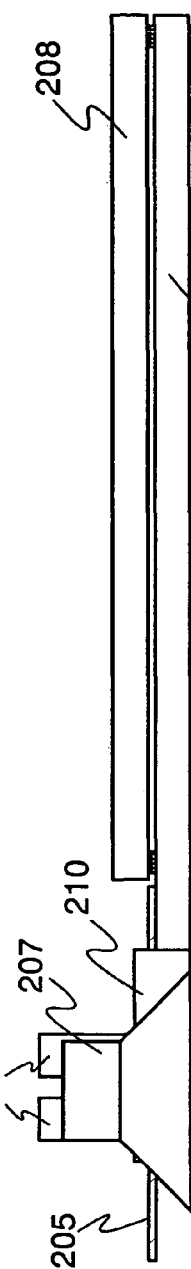
Fig. 2A
Fig. 2B
PRIOR ART

AUDIO SIGNAL PROCESSING CIRCUIT AND A DISPLAY DEVICE INCORPORATING THE SAME

BACKGROUND OF THE INVENTION

1. Field of the Invention

The present invention relates to an audio signal processing circuit, and more particularly to an audio signal processing circuit which is composed of thin film semiconductor elements. Further, the present invention relates to a display device comprising the audio signal processing circuit.

2. Description of the Related Art

In recent years, mobile phones have been widely used with the advance of the communication technology. In the future, transmission of moving images and transmission of a larger amount of information are expected. On the other hand, by reducing weight of personal computers, those adapted for mobile communication have been produced. The information terminal called a PDA originated in electronic notebooks has also been produced in large quantities and is expected to be widely used. In addition, most of those portable information equipment are equipped with a flat panel display with the development of display devices.

Additionally, in recent years, in active matrix display devices, manufacturing of a display device for which a thin film element (typical example is a thin film transistor; hereafter referred to as a TFT) using a polycrystalline semiconductor crystallized by low temperature is used has been promoted. The low temperature mentioned above means that a crystallization temperature of 600° C. or less is lower compared to a conventional crystallization temperature of 1000° C. or more. With the TFT using the polycrystalline semiconductor crystallized by low temperature, as well as a pixel, a signal driver circuit can be integrally formed around a pixel portion. Thus, it is possible to realize a compactness and a high definition of a display device and it is expected to be more widely used in the future.

On the other hand, for the portable information equipment, other output functions, particularly an audio output function is required as well as a visual display function. By displaying an image with sound, it becomes possible to view the image effectively and enjoy the image more.

A current audio output device outputs sound by converting electric signals into sound using a cone speaker or the like. Since the cone speaker occupies large space in a portable information equipment, reduction in size and weight of the portable information equipment has been prevented.

FIG. 2A is a top plan view of a periphery of a display device in a portable information equipment 201 with a conventional audio output function. FIG. 2B is a cross-sectional view. The display device has a substrate 209 on which a pixel portion 204, a source signal driver circuit 202, a gate signal driver circuit 203 are integrally formed. Attached to the display device are a cone speaker 207, an FPC 205, a counter substrate 208, and a printed circuit board 206 on which an audio signal processing circuit 210 and a coupling capacitor 211 are mounted.

The cone speaker 207 is not suitable for reduction in size and weight of portable information equipment due to its large size. For the above-mentioned reason, a flat speaker as shown in FIGS. 3A and 3B is being developed. FIG. 3A is a top plan view of the periphery of a display device in a portable information equipment 301 with a flat speaker. FIG. 3B is a cross-sectional view. The display device has a substrate 309 on which a pixel portion 304, a source signal driver circuit 302, a gate signal driver circuit 303 are integrally formed. Attached to the display device are a flat speaker 306, FPCs 305 and 308, a counter substrate 310, and a printed circuit board 311 on which an audio signal processing circuit 307 and a coupling capacitor 312 are mounted.

The flat speaker is similar to conventional cone speakers in that electric signals are converted into vibrations to output sound, but is different in that a glass substrate, a plastic substrate, a touch panel, or the like in the display device and the like is vibrated instead of a cone speaker. With such a flat speaker, the portable information equipment with a smaller size and lighter weight than the one using a conventional cone speaker can be realized.

In addition, using a multilayer ceramic chip capacitor as a capacitor, the case of mounting that chip capacitor on an FPC (flexible printed circuit) (e.g. Patent Document 1: Japanese Laid-Open Patent Application No. Hei 11-326937) and the case of mounting that chip capacitor on a substrate of a display device (e.g. Patent Document 2: Japanese Laid-Open Patent Application. No. Hei 7-261191) are reported. This kind of chip capacitors with a long side of approximately 2 to 3 mm has a great advantage in reducing the volume.

Although the flat speaker is a very effective mean for reduction in size and weight of portable information equipment as described above, there are problems to be solved. For the audio signal processing circuit 307 which drives the flat speaker 306, as shown in FIGS. 3A and 3B, the printed circuit board 311 is set to the external of the display device with the audio signal processing circuit 307 made of a LSI mounted thereon as a conventional audio signal processing circuit. Therefore, this is still insufficient for reduction in size and weight of a portable information equipment. In addition, since the audio signal frequency is low, the coupling capacitor 312 having a large capacitance value (for example, 10 to 100 iF) is required for coupling an audio signal with a capacitor. For this kind of capacitors, there are no other choices than an electrostatic capacitor, which has a large volume (typically a cylinder form with a diameter of approximately 5 to 10 mm and a height of 7 to 10 mm). Therefore, the volume of a circuit has been increased.

Although a multilayer ceramic chip capacitor as the one mentioned in Patent Document 1 and Patent Document 2 has smaller volume than an electrostatic capacitor, it has a problem in that the maximum capacitance value is approximately 0.1 iF at most. Thus, it is necessary to increase the resistance value of a resistor in order to constitute a coupling of an audio signal processing circuit 307 by a chip capacitor. When the lowest frequency of the audio signal is 20 Hz and the capacity is 0.1 iF, a resistance value of approximately 80 kΩ or more is required.

In the case where the resistor is used as a chip component like other components, it causes the deterioration in a frequency characteristic of the audio signal processing circuit 307. The reason is that when drawing the circuit to a printed circuit board 311 or an FPC 308, parasitic capacitances arise at terminal portions and then low pass filters are formed between the parasitic capacitances and the chip resistor, and therefore to reduce a frequency characteristic. For example, considered hereinafter will be the case of an amplifier circuit for 10 times amplification with a circuit structure as shown in FIG. 4. An audio signal processing circuit 401 includes an operational amplifier 402. An amplifier circuit is composed of the operational amplifier 402, external resistors 403, 404, and 405, external capacitors 406 and 407, a signal source 408, and a bias supply 414.

When the resistance values of the external resistors 404 and 405 are referred to as R404 and R405 respectively, a gain (1+ (R405/R404)) of the amplifier circuit is obtained in the circuit as shown in FIG. 4. On the other hand, in order to obtain a low frequency of at least 20 Hz with a chip capacitor having a capacity of 0.1 iF, it is necessary to set the resistance value of the external resistors 403 and 404 at 80 kΩ or more, as described above. Assuming here that each of the external resistors 403 and 404 is respectively set to have a resistance value of 100 kΩ with some margin, the external resistor 405 of 900 kΩ is required for obtaining a gain of 10 times as large in the amplifier circuit.

However, parasitic capacitors as the ones denoted by reference numerals 409 to 413 arisen by setting input and output terminals of the operational amplifier 402 at an external portion of the audio signal processing circuit as shown in FIG. 4. In particular, since the parasitic capacitor 410 arises in parallel with the external resistor 405 of 900 kΩ, a low pass filter is formed therebetween. When the value of the parasitic capacitor 410 reaches 10 pF, a low pass filter of 17 kHz is formed. Because of the low path filter, the high frequency side of an amplifier is limited and a problem of reducing the frequency characteristic occurs. Comparing a case 601 of having a parasitic low pass filter with a case 602 of not having a parasitic low pass filter as shown in FIG. 6, there is a remarkable difference in frequency characteristics of them.

In an audio signal processing circuit composed of an external resistor incorporated in a conventional IC using single crystal silicon, the same problem occurs. An example will be explained with reference to FIG. 5. In an IC using single crystal silicon, MOS transistors and a resistor are formed on a silicon substrate 501. In FIG. 5, 502 and 503 denote a source region and a drain region of a MOS transistor respectively, 504 denotes a channel region, 505 denotes a LOCOS (LOCal Oxidation of Silicon) film, 506 denotes a gate insulating film, 507 denotes a gate electrode, 508 denotes an interlayer film, 509 denotes a source electrode, and 510 denotes a drain electrode. As for a resistor 511 formed on the LOCOS film 505, one terminal is connected to the drain electrode 510 and the other terminal is connected to the electrode 512. Because the LOCOS film 505 is approximately 200 to 5000 nm in thickness, there is a parasitic capacitor 513 between the silicon substrate 501 and the resistor 511. The resistor of approximately 1 MΩ causes a parasitic capacitance of several pF. A silicon substrate is a conductor, and is typically connected to a GND and the like. Therefore, the same problem as the above occurs and the frequency characteristic has been deteriorated.

SUMMARY OF THE INVENTION

In view of the foregoing problems, the present invention provides an audio signal processing circuit reduced in size, a display device incorporating the audio signal processing circuit, and electronic equipment with small size and lightweight.

The object of the invention is to provide an audio signal processing circuit comprising thin film elements and a thin film resistor formed on an insulating substrate. In addition, to provide a display device incorporating an audio signal processing circuit comprising a thin film resistor formed on an insulating substrate is another object of the invention. For the case of this configuration, a terminal parasitic capacitor does not become a problem. Furthermore, there is an advantage in that the thin film resistor formed on the insulating substrate does not cause a problem of the parasitic capacitance between a substrate and a resistor like a resistor in an IC.

A configuration of the invention will be described hereinafter.

According to the invention, concerning an audio signal processing circuit comprises thin film elements formed on an insulating substrate, an input circuit comprises a thin film resistor formed on the insulating substrate and a chip capacitor mounted on the insulating substrate.

According to the invention, concerning an audio signal processing circuit comprises thin film elements formed on an insulating substrate, an input circuit comprises a thin film resistor formed on the insulating substrate and a chip capacitor mounted on a flexible substrate which is connected to the insulating substrate.

According to the invention, concerning an audio signal processing circuit comprises thin film elements formed on an insulating substrate, an input circuit comprises a thin film resistor formed on the insulating substrate and a chip capacitor mounted on a printed circuit board which is electrically connected to the insulating substrate.

According to the invention, concerning an audio signal processing circuit comprises thin film elements formed on an insulating substrate, a feedback circuit comprises a thin film resistor formed on the insulating substrate and a chip capacitor mounted on the insulating substrate.

According to the invention, concerning an audio signal processing circuit comprises thin film elements formed on an insulating substrate, a feedback circuit comprises a thin film resistor formed on the insulating substrate and a chip capacitor mounted on a flexible substrate which is connected to the insulating substrate.

According to the invention, concerning an audio signal processing circuit comprises thin film elements formed on an insulating substrate, a feedback circuit comprises a thin film resistor formed on the insulating substrate and a chip capacitor mounted on a printed circuit board which is electrically connected to the insulating substrate.

According to the invention, concerning an audio signal processing circuit comprises thin film elements formed on an insulating substrate, a smoothing circuit comprises a thin film resistor formed on the insulating substrate and a chip capacitor mounted on the insulating substrate.

According to the invention, concerning an audio signal processing circuit comprises thin film elements formed on an insulating substrate, a smoothing circuit comprises a thin film resistor formed on the insulating substrate and a chip capacitor mounted on a flexible substrate which is connected to the insulating substrate.

According to the invention, concerning an audio signal processing circuit comprises thin film elements formed on an insulating substrate, a smoothing circuit comprises a thin film resistor formed on the insulating substrate and a chip capacitor mounted on a printed circuit board which is electrically connected to the insulating substrate.

According to the invention, in the audio signal processing circuit, P-type impurities are doped in the thin film resistor.

According to the invention, in the audio signal processing circuit, the thin film resistor has a resistance value of 80 kΩ or more.

According to the invention, concerning a display device includes an audio signal processing circuit, an input circuit of the audio signal processing circuit comprises thin film elements and a thin film resistor formed on an insulating substrate and a chip capacitor mounted on the insulating substrate.

According to the invention, concerning a display device includes an audio signal processing circuit, an input circuit of the audio signal processing circuit comprises thin film elements and a thin film resistor formed on an insulating substrate and a chip capacitor mounted on a flexible substrate which is connected to the insulating substrate.

According to the invention, concerning a display device includes an audio signal processing circuit, an input circuit of the audio signal processing circuit comprises thin film elements and a thin film resistor formed on an insulating substrate and a chip capacitor mounted on a printed circuit board which is electrically connected to the insulating substrate.

According to the invention, concerning a display device includes an audio signal processing circuit, a feedback circuit of the audio signal processing circuit comprises thin film elements and a thin film resistor formed on an insulating substrate and a chip capacitor mounted on the insulating substrate.

According to the invention, concerning a display device includes an audio signal processing circuit, a feedback circuit of the audio signal processing circuit comprises thin film elements and a thin film resistor formed on an insulating substrate and a chip capacitor mounted on a flexible substrate which is connected to the insulating substrate.

According to the invention, concerning a display device includes an audio signal processing circuit, a feedback circuit of the audio signal processing circuit comprises thin film elements and a thin film resistor formed on an insulating substrate and a chip capacitor mounted on a printed circuit board which is electrically connected to the insulating substrate.

According to the invention, concerning a display device includes an audio signal processing circuit, a smoothing circuit of the audio signal processing circuit comprises thin film elements and a thin film resistor formed on an insulating substrate and a chip capacitor mounted on the insulating substrate.

According to the invention, concerning a display device includes an audio signal processing circuit, a smoothing circuit of the audio signal processing circuit comprises thin film elements and a thin film resistor formed on an insulating substrate and a chip capacitor mounted on a flexible substrate which is connected to the insulating substrate.

According to the invention, concerning a display device includes an audio signal processing circuit, a smoothing circuit of the audio signal processing circuit comprises thin film elements and a thin film resistor formed on an insulating substrate and a chip capacitor mounted on a printed circuit board which is electrically connected to the insulating substrate.

According to the invention, in the display device, P-type impurities are doped in the thin film resistor.

According to the invention, in the display device, the thin film resistor has a resistance value of 80 k$\Omega$ or more.

According to the invention, portable information equipment uses the display device mentioned above.

By means of the foregoing, a capacitor with smaller size can be realized and an audio signal processing circuit can be incorporated into a display device. Consequently, electronic equipment, typically a portable information equipment, with small size and lightweight which is capable of outputting a sound can be realized.

In a conventional portable information equipment with an audio output function, an electrostatic capacitor is used in an audio signal processing circuit. Thus, the reduction in size of the audio signal processing circuit is difficult and the conventional portable information equipment with an audio output function prevents the reduction in size of portable information equipment.

According to the invention, an audio signal processing circuit with a small volume and a display device incorporating the audio signal processing circuit can be realized by composing the audio signal processing circuit with thin film elements, particularly by using a thin film resistor as a resistor and a capacitor with small capacitance. The invention makes it possible to reduce in size and weight of a portable information equipment with an audio output function.

BRIEF DESCRIPTION OF THE DRAWINGS

FIGS. 2A and 2B are a top plane view and a cross-sectional view of a conventional display device.

DETAILED DESCRIPTION OF THE INVENTION

Figure 1:
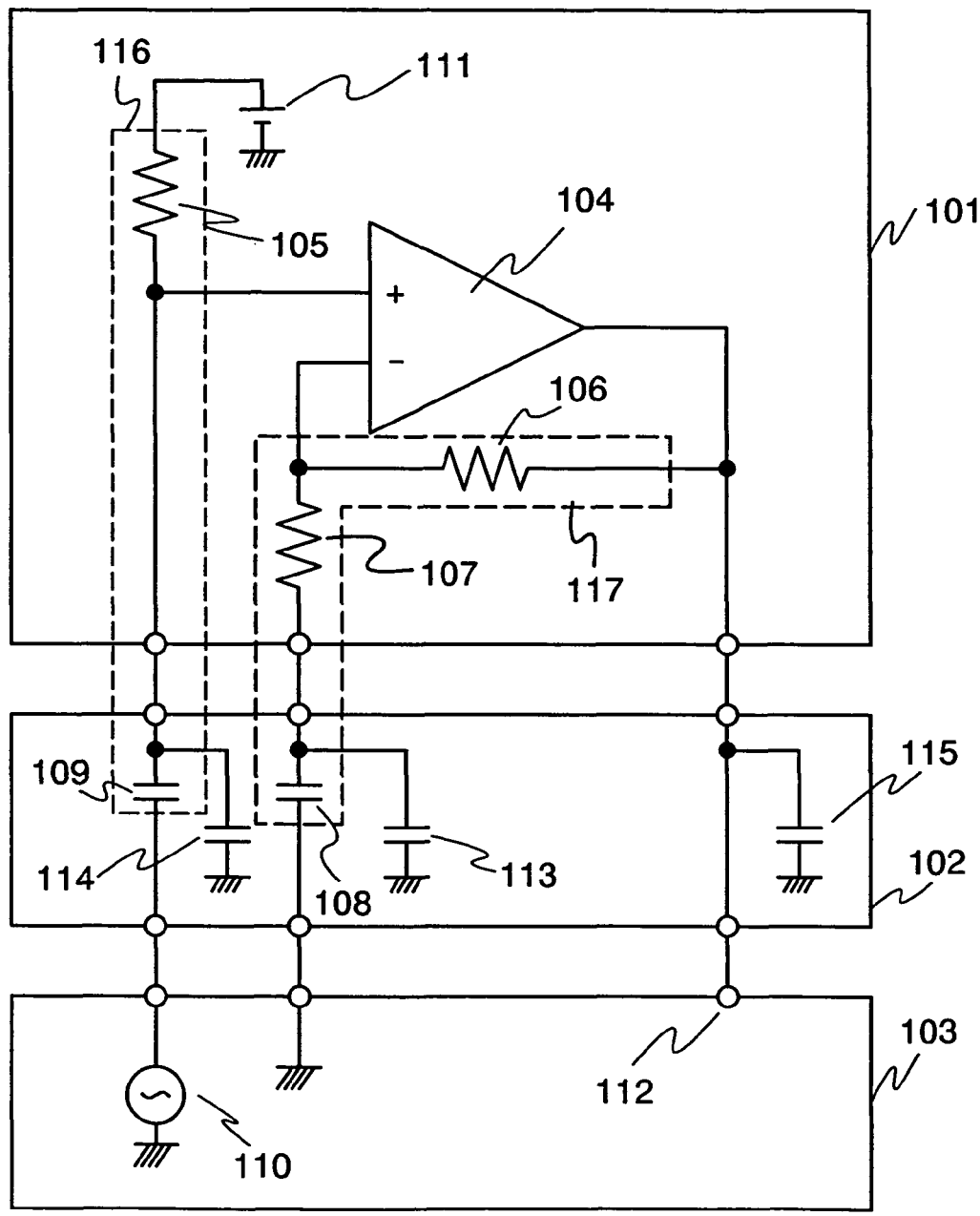
FIG. 1 is an equivalent circuit diagram showing an audio signal processing circuit.
Figures 3A, 3B:
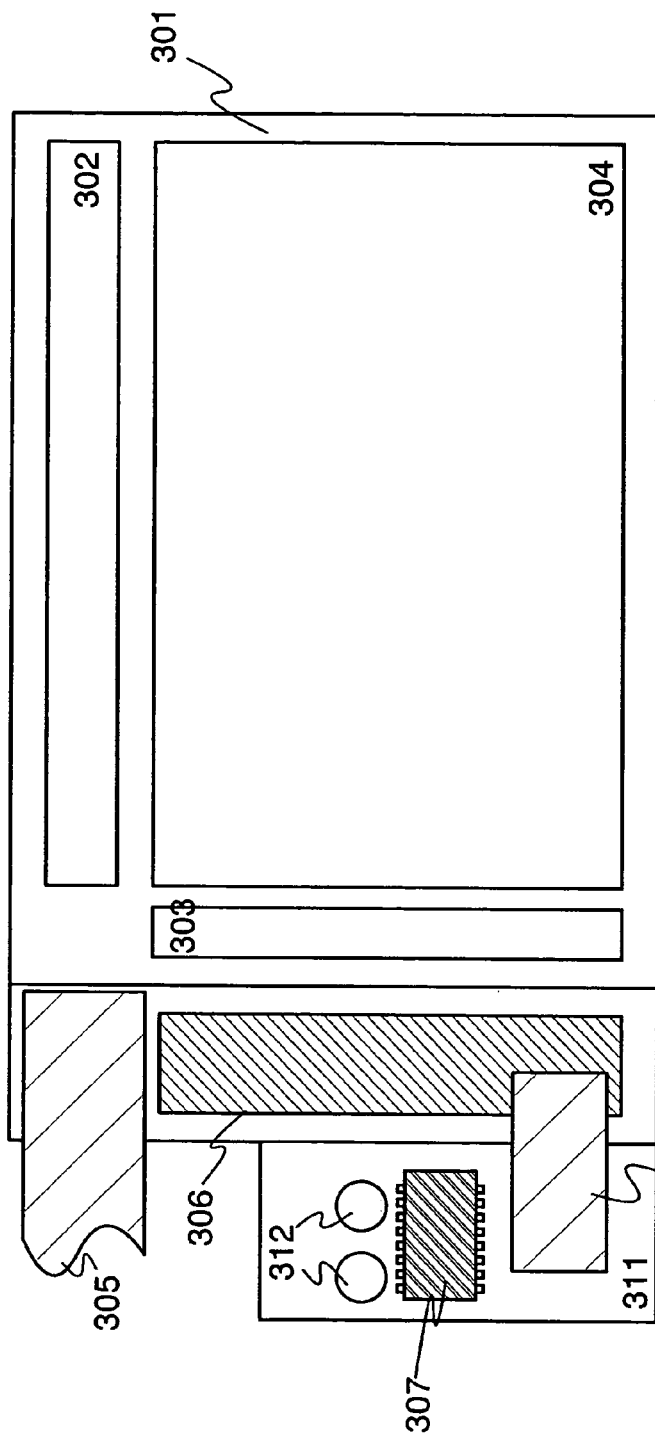
FIGS. 3A and 3B are a top plane view and a cross-sectional view of a conventional display device.
Figure 4:
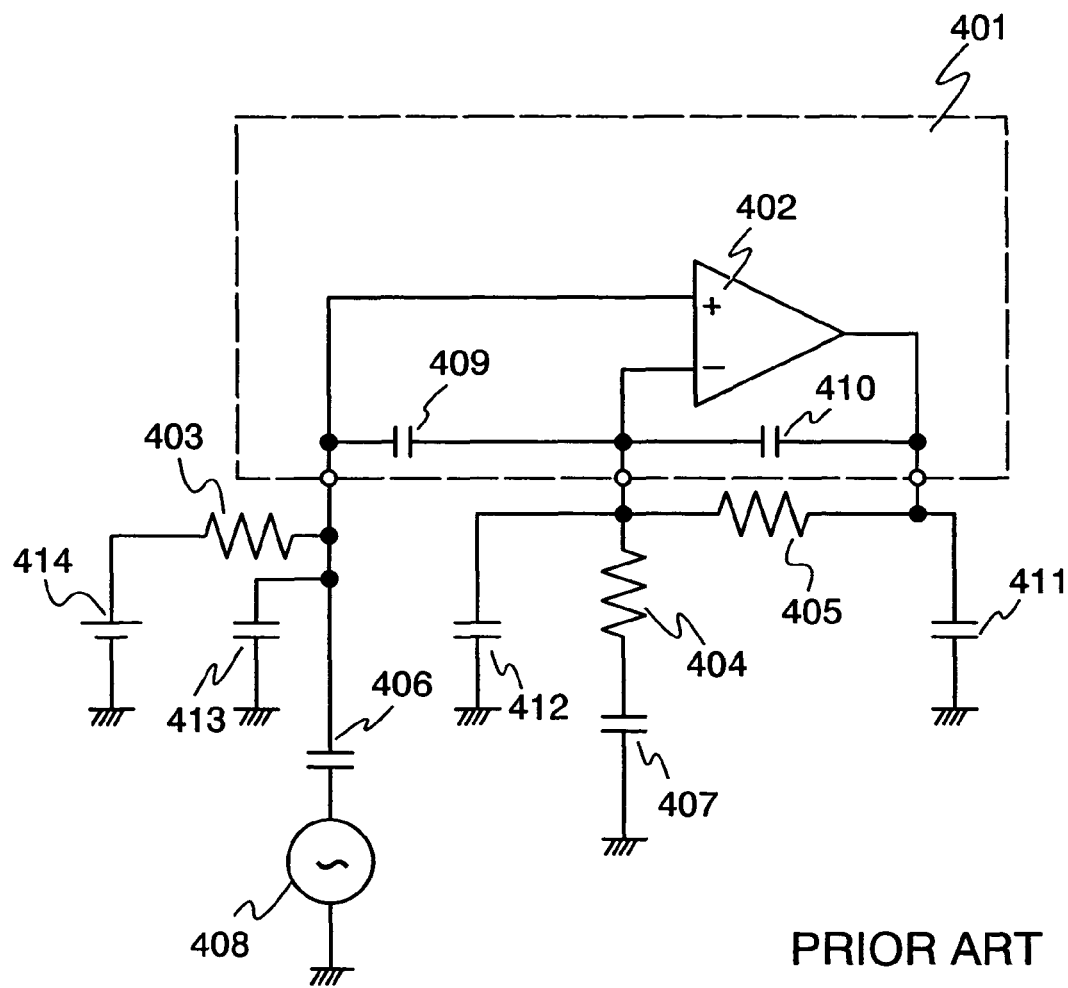
FIG. 4 is an equivalent circuit diagram showing a conventional audio signal processing circuit.
Figure 5:
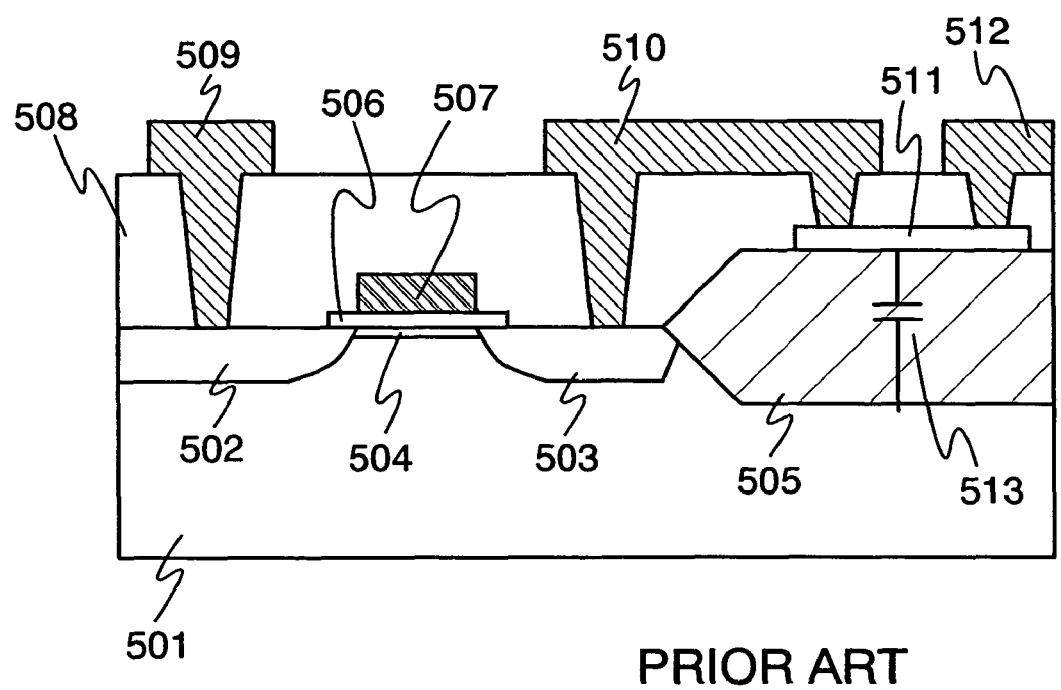
FIG. 5 is a cross-sectional view of a conventional audio signal processing IC.
Figure 6:
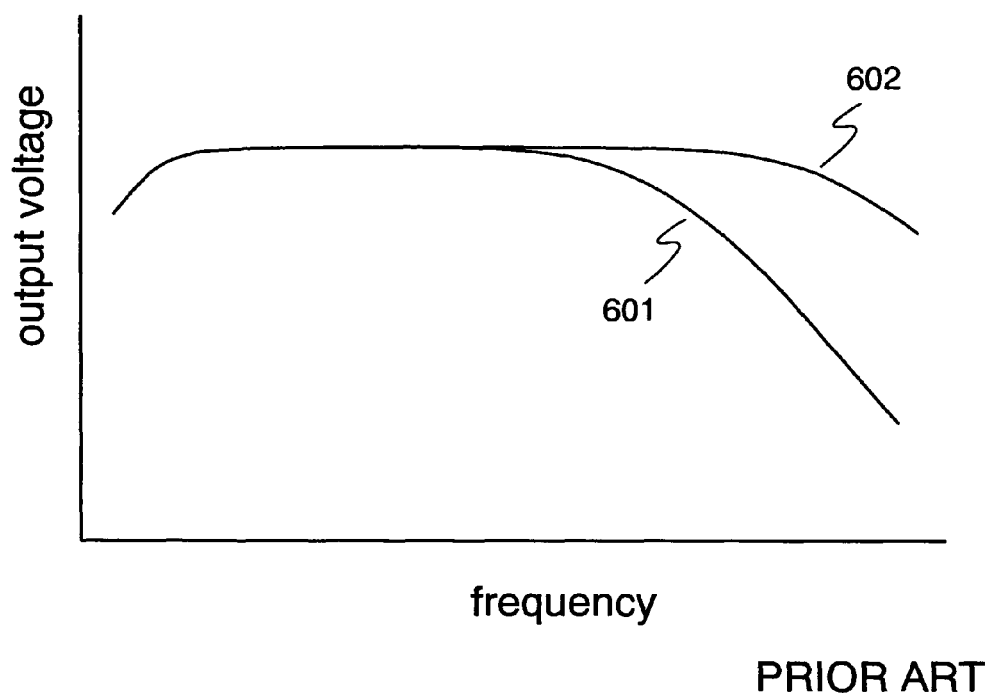
FIG. 6 is a chart showing frequency characteristics of a conventional audio signal processing circuit.

Hereinafter, embodiment modes of the present invention will be explained with reference to the Figures. FIG. 1 shows an embodiment mode of an amplifier circuit of an audio signal processing circuit formed on an insulating substrate101. This amplifier circuit comprises an operational amplifier 104 which is composed of thin film elements such as TFTs, thin film resistors 105, 106 and 107, a power supply 111, an FPC 102, and chip capacitors 108 and 109 formed on the FPC. The thin film resistor 105 and the chip capacitor 109 compose an input circuit 116, and the thin film resistors 106 and 107 and the chip capacitor 108 compose a feedback circuit 117.

By composing the input circuit 116 with the thin film resistor 105 as described above, the bulk of parasitic capacitance to be arisen in the input circuit 116 become a parasitic capacitor 114 on the FPC 102 and the frequency characteristic can be improved. In addition, by composing the feedback circuit 117 with the thin film resistors 106 and 107 as described above, the bulk of parasitic capacitances to be arisen in the feedback circuit 117 becomes a parasitic capacitor 113. In particular, as the thin film resistor 106 has far less parasitic capacitance as compared with the conventional one, thus the frequency characteristic can be improved.

The operation of the present embodiment mode will be explained next. A signal output from a signal source 110 on a printed circuit board 103 is input to the operational amplifier 104 and the thin film resistor 105 through the chip capacitor 109. A DC voltage of the signal source 110 is typically 0 V, and DC voltages of the thin film resistor 105 and of the input of the operational amplifier 104 are supplied by the power supply 111. Thus, they are not equal to each other. Therefore, a DC voltage is divided with the chip capacitor 109. The thin film resistor 105 and the chip capacitor 109 compose the input circuit 116. A signal input to the operational amplifier 104 is output to a terminal 112 after being amplified. Here, the thin film resistors 106 and 107 and the chip capacitor 108 compose the feedback circuit 117, and a gain of the operational amplifier 104 is determined by the resistance ratio of the thin film resistor 106 to the thin film resistor 107.

In order to obtain a low frequency of at least 20 Hz with the chip capacitor 108 having the capacitance of 0.1 iF and with a gain of 10 times as large, it is necessary to set the thin film resistor 107 at 100 kΩ and the thin film resistor 106 at 900 kΩ, as described above. According to the embodiment mode, no parasitic low path filters are formed by the parasitic capacitors 113 and 114 since only one of two terminals of each thin film resistor is in the outside. Therefore, there is no possibility of reducing a frequency characteristic in high frequency unlike the conventional circuit.

Furthermore, since the substrate 101 of the thin film resistors 105 to 107 of the invention is an insulator, no low path filters are formed by the capacitance between a resistor and a substrate unlike an IC using a single crystal silicon substrate. Therefore, the advantageous effect is obtained in the input circuit 116 described above as well as in the feedback circuit 117. As described above, in the invention, a chip capacitor whose capacitance is small can be used as a capacitor since a resistor having high resistance of 80 kΩ or more can be formed without causing deterioration in a frequency characteristic in high frequency. Therefore, it is possible to reduce the volume of a circuit including an external circuit, thus it serves for the reduction in weight, thinness and size of a device. Described above is an example in which chip capacitors 105 to 109 are mounted on an FPC 102. However, the mounting position of the chip capacitor is not limited to the FPC 102, it may be mounted on an insulating substrate 101 or on a printed circuit board 103 which is electrically connected to the insulating substrate.

Embodiment 1

Figure 11:
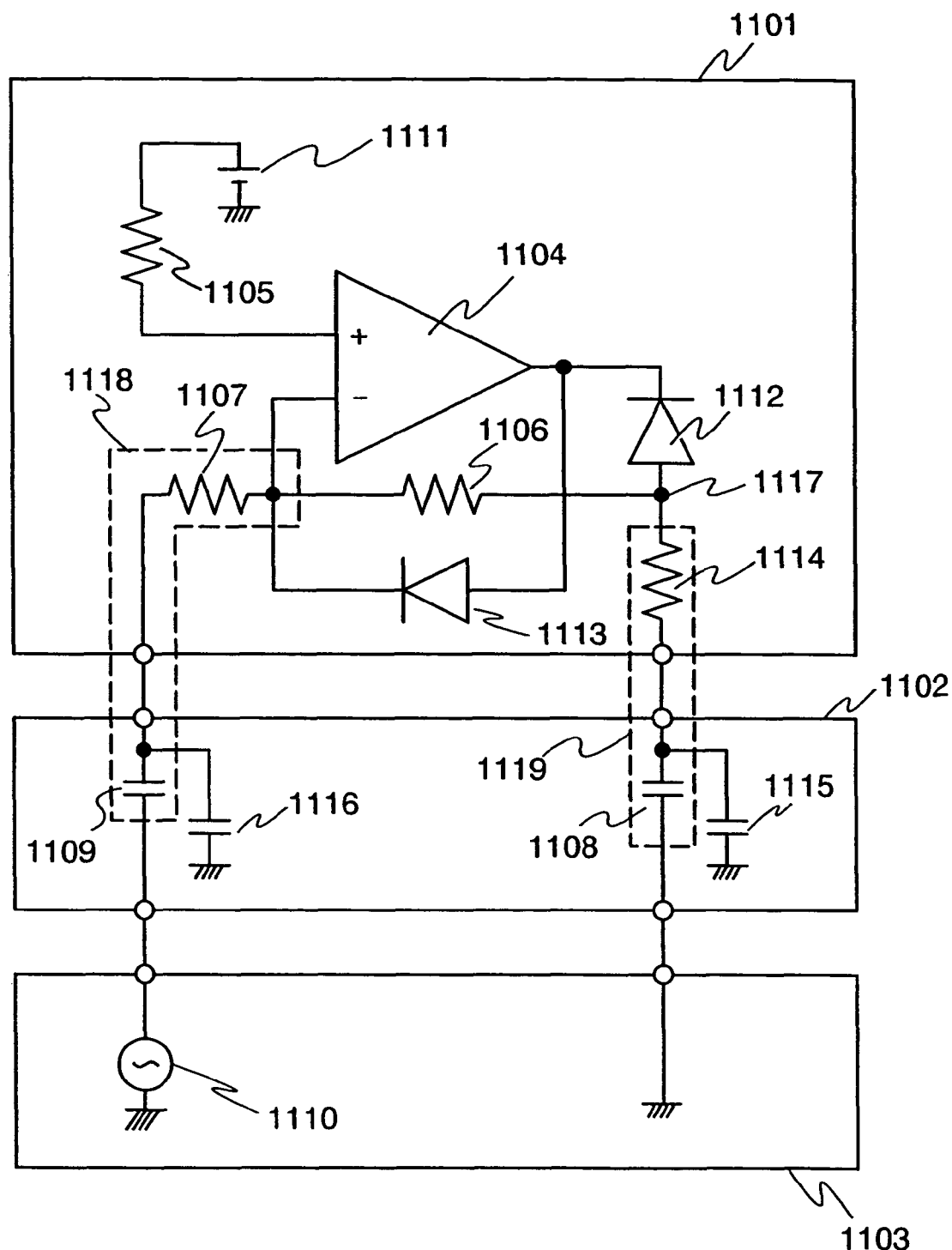
FIG. 11 is an equivalent circuit diagram showing a rectifier circuit.

An embodiment of the present invention is shown in FIG. 11. The present embodiment shows a half-wave rectifier circuit on an insulating substrate 1101. A rectifier circuit is used for the level detection of signals. The half-wave rectifier circuit of the embodiment comprises an operational amplifier 1104 composed of thin film elements such as TFTs, thin film resistors 1105, 1106, 1107 and 1114, thin film diodes 1112 and 1113, a power supply 1111, an FPC1102, and chip capacitors 1108 and 1109 on the FPC 1102. The operation of the half-wave rectifier circuit will be explained hereinafter.

A signal output from a signal source 1110 on a printed circuit board 1103 is input to the thin film resistor 1107 through the chip capacitor 1109. The thin film resistor 1107 and the chip capacitor 1109 configure an input circuit 1118. As for the thin film resistor 1107, one terminal is connected to the chip capacitor 1109 and the other terminal is connected to an inverting input terminal of the operational amplifier 1104. Assuming that a center of a signal is 0 V, in case where an input signal becomes to the lower (a negative amplitude), an output signal of the operational amplifier 1104 becomes to the upper (a positive amplitude). A current flows from the output terminal of the operational amplifier 1104 to the signal source 1110 through the thin film diode 1113 and the thin film resistor 1107. At this time, a voltage of a connection node 1117 becomes equal to a voltage of the inverting input terminal of the operational amplifier 1104.

In case where the input signal becomes to the lower (a negative amplitude), a fixed voltage (a voltage of the power supply 1111) is output to the connection node 1117 since the voltage of the inverting input terminal of the operational amplifier 1104 is approximately equal to the voltage of the power supply 1111. In case where the signal from the signal source 1110 becomes to the upper (a positive amplitude), a current flows from the signal source 1110 to the thin film resistor 1106, the thin film diode 1112, and finally to an output terminal of the operational amplifier 1104 through the chip capacitor 1109 and the thin film resistor 1107. At this time, a signal having a reverse phase to that of the input signal arises at the connection node 1117. The half-wave rectification is carried out in this manner.

The thin film resistor 1114 is connected to the connection node 1117 and the smoothing is carried out by the chip capacitor 1108. The thin film resistor 1114 and the chip capacitor 1108 compose a smoothing circuit 1119. According to the embodiment, the bulk of parasitic capacitances to be arisen becomes parasitic capacitor 1115 and 1116 on FPC 1102.

and the deterioration in the frequency characteristic can be prevented by incorporating the thin film resistors 1107, 1106, and 1114 into the half-wave rectifier circuit. Described above is an example in which chip capacitors 1108 and 1109 are mounted on the FPC 1102. However, the mounting position of the chip capacitor is not limited to the FPC 1102, it may be mounted on an insulating substrate 1101 or on a printed circuit board 1103 which is electrically connected to the insulating substrate.

Embodiment 2

Figure 8:
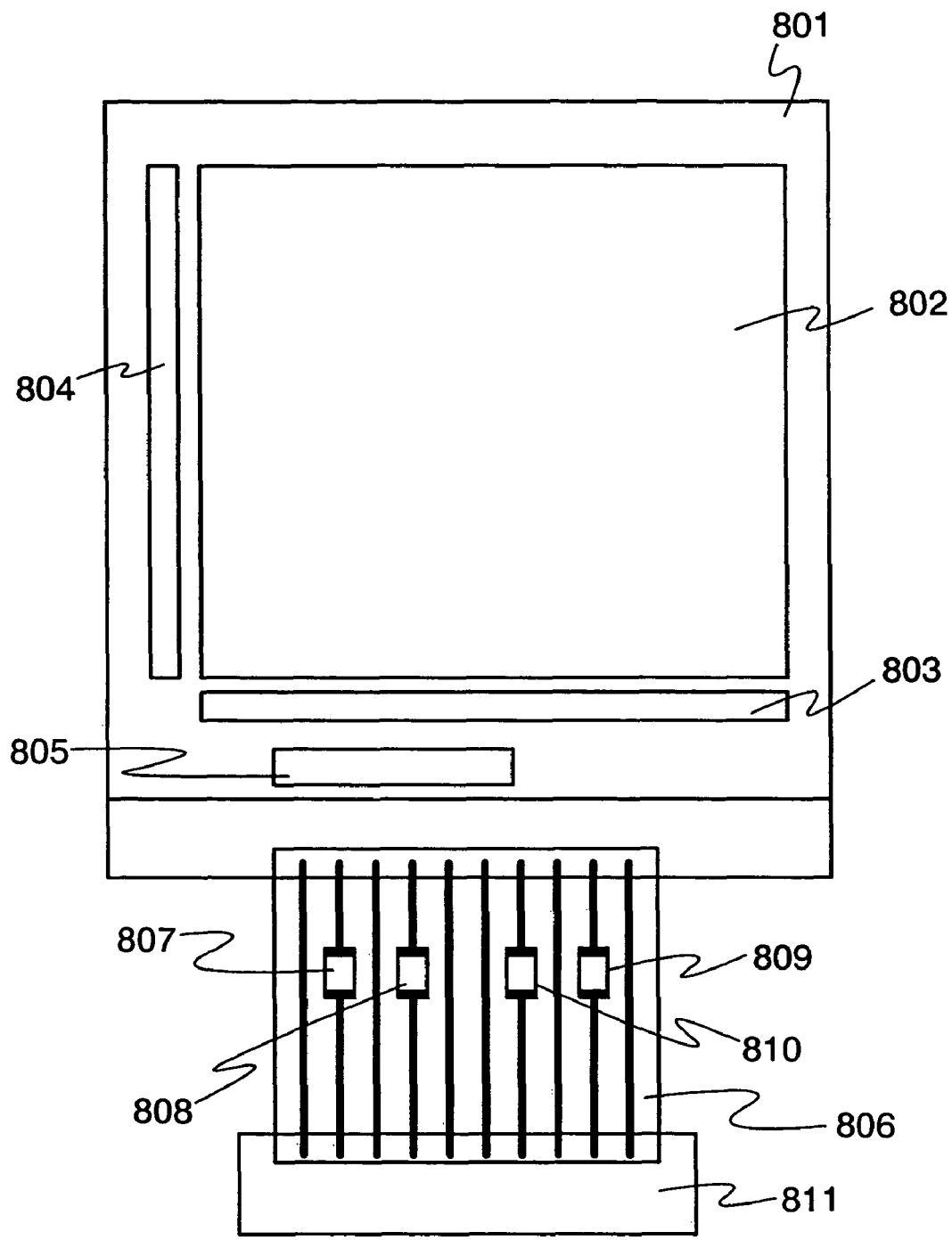
FIG. 8 is a view showing an embodiment of a display device.

An embodiment of the display device of the present invention is shown in FIG. 8. The present embodiment shows an example in which a chip capacitor for an audio signal processing circuit is installed on an FPC. The explanation of FIG. 8 will be made below. Reference numeral 801 denotes a display device incorporating an audio signal processing circuit. TFTs are formed on an insulating substrate and disposed in a matrix manner in a pixel portion 802. In addition, a source driver circuit 803 and a gate driver circuit 804 are composed of the TFTs as well as pixels. Furthermore, an audio signal processing circuit 805 is also configured by the TFTs. The display device 801 is equipped with an FPC 806 for sending signals to these circuits on the insulating substrate, chip capacitors 807 to 810 mounted on the FPC 806, and a printed circuit board 811.

The audio signal processing circuit 805 includes an analog amplifier circuit for processing a sound, however, the invention is not limited to this embodiment. The audio signal processing circuit 805 may comprise thin film resistors of the invention and chip capacitors. The deterioration in the frequency characteristic can be prevented by configuring an input circuit, a feedback circuit, and a smoothing circuit with the thin film resistors and the chip capacitors.

Embodiment 3

Figure 9:
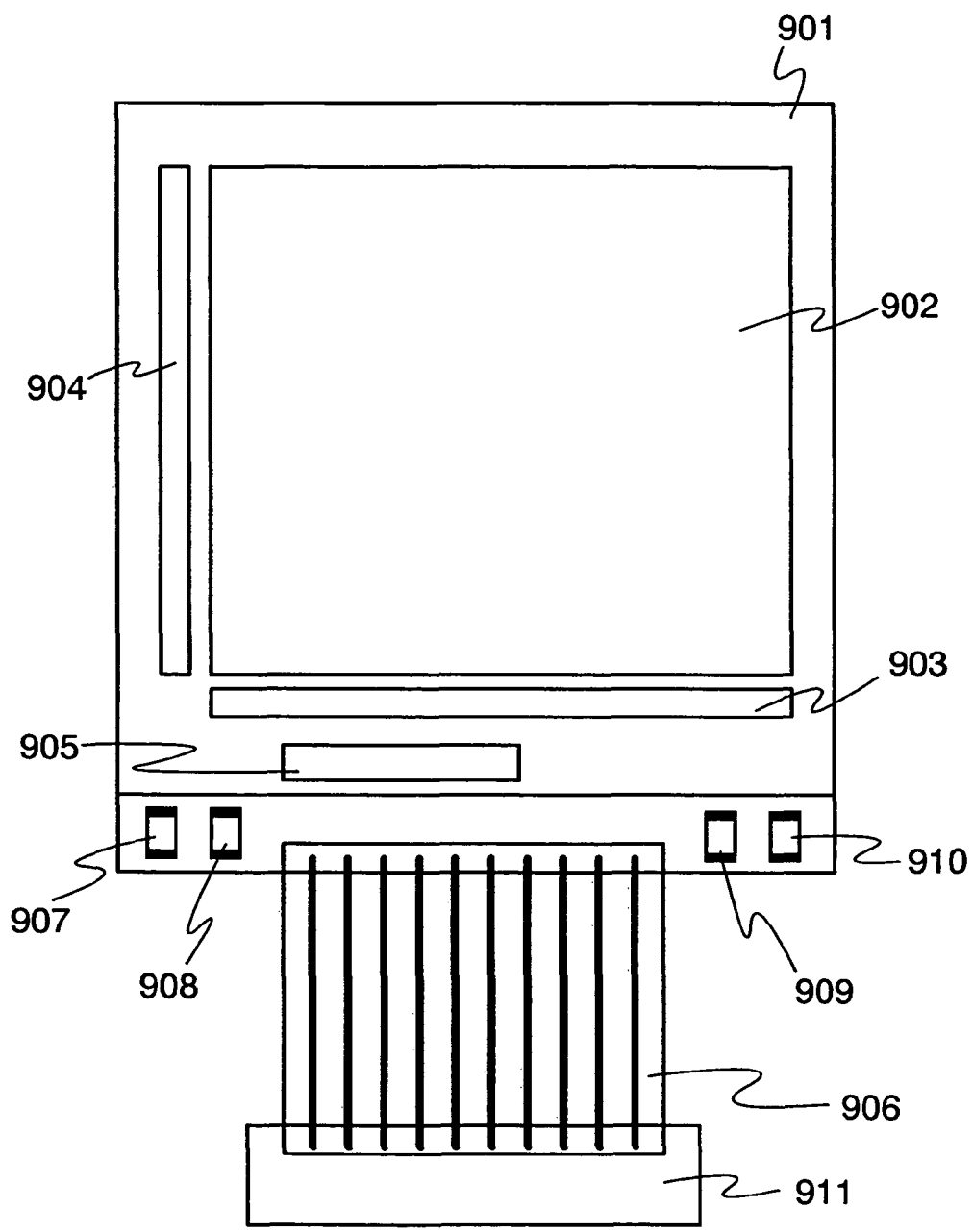
FIG. 9 is a view showing an embodiment of a display device.

An embodiment of the display device of the present invention is shown in FIG. 9. The present embodiment shows an example in which a chip capacitor for an audio signal processing circuit is installed on an insulating substrate. The explanation of FIG. 9 will be made below. Reference numeral 901 denotes a display device incorporating an audio signal processing circuit 905. TFTs are formed on an insulating substrate and disposed in a matrix manner in a pixel portion 902. In addition, a source driver circuit 903 and a gate driver circuit 904 are composed of the TFTs as well as pixels. Furthermore, an audio signal processing circuit 905 is also configured by the TFTs. The display device 901 is equipped with an FPC 906 for sending signals to these circuits on the insulating substrate, chip capacitors 907 to 910 mounted on the insulating substrate, and a printed circuit board 911.

The audio signal processing circuit 905 includes an analog amplifier circuit for processing a sound, however, the invention is not limited to this embodiment. The audio signal processing circuit 905 may comprise thin film resistors of the invention and chip capacitors. The deterioration in the frequency characteristic can be prevented by configuring an input circuit, a feedback circuit, and a smoothing circuit with the thin film resistors and the chip capacitors.

Embodiment 4

Figure 13:
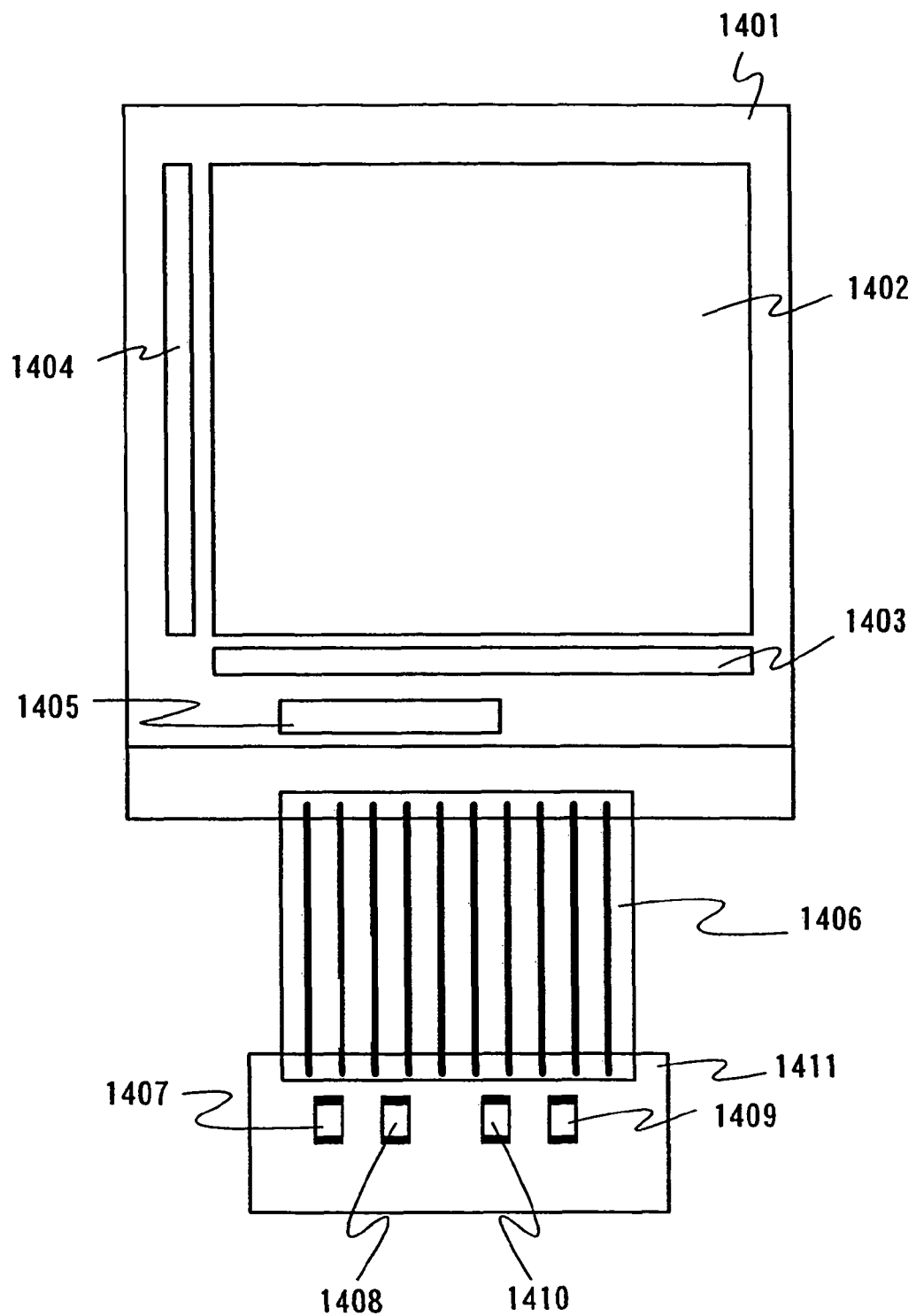
FIG. 13 is a view showing a display device.
Figure 14D:
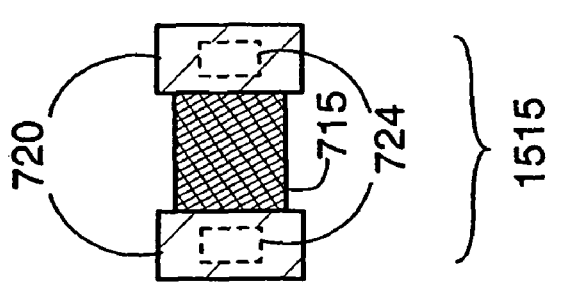
FIGS. 14A to 14D are top plane views of thin film elements.
Figure 14C:
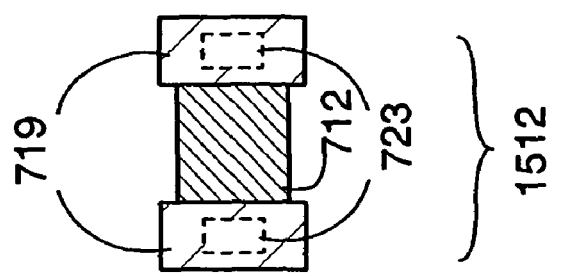
Figure 14B:
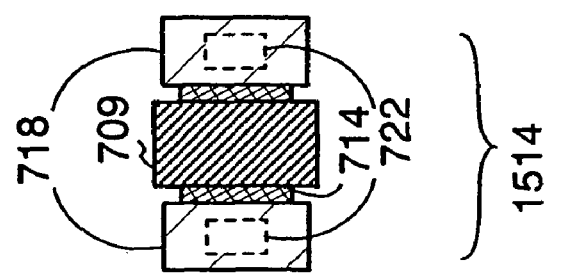
Figure 14A:
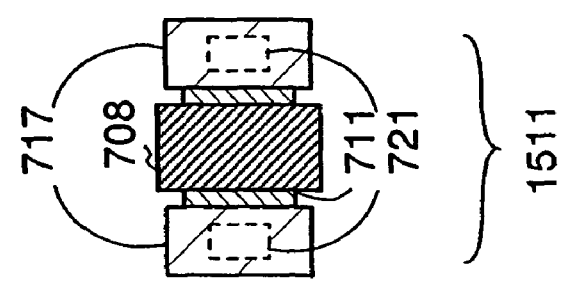

An embodiment of the display device of the present invention is shown in FIG. 13. The present embodiment shows an example in which a chip capacitor for an audio signal processing circuit is installed on a printed circuit board. The explanation of FIG. 13 will be made below. Reference numeral 1401 denotes a display device incorporating an audio signal processing circuit. TFTs are formed on an insulating substrate and disposed in a matrix manner in a pixel portion 1402. In addition, a source driver circuit 1403 and a gate driver circuit 1404 are composed of the TFTs as well as pixels. Furthermore, an audio signal processing circuit 1405 is also configured by the TFTs. The display device 1401 is equipped with an FPC 1406 for sending signals to these circuits on the insulating substrate, a printed circuit board 1411 which is electrically connected to the insulating substrate, chip capacitors 1407 to 1410 mounted on the printed circuit board 1411.

For the audio signal processing circuit 1405 of the embodiment, the one shown in the embodiment mode can be used. The audio signal processing circuit includes an analog amplifier circuit for processing a sound, however, the invention is not limited to this embodiment. The audio signal processing circuit 1405 comprises thin film resistors of the invention. The deterioration in the frequency characteristic can be prevented by configuring an input circuit, a feedback circuit, and a smoothing circuit with the thin film resistors and the chip capacitors.

Embodiment 5

Figure 7:
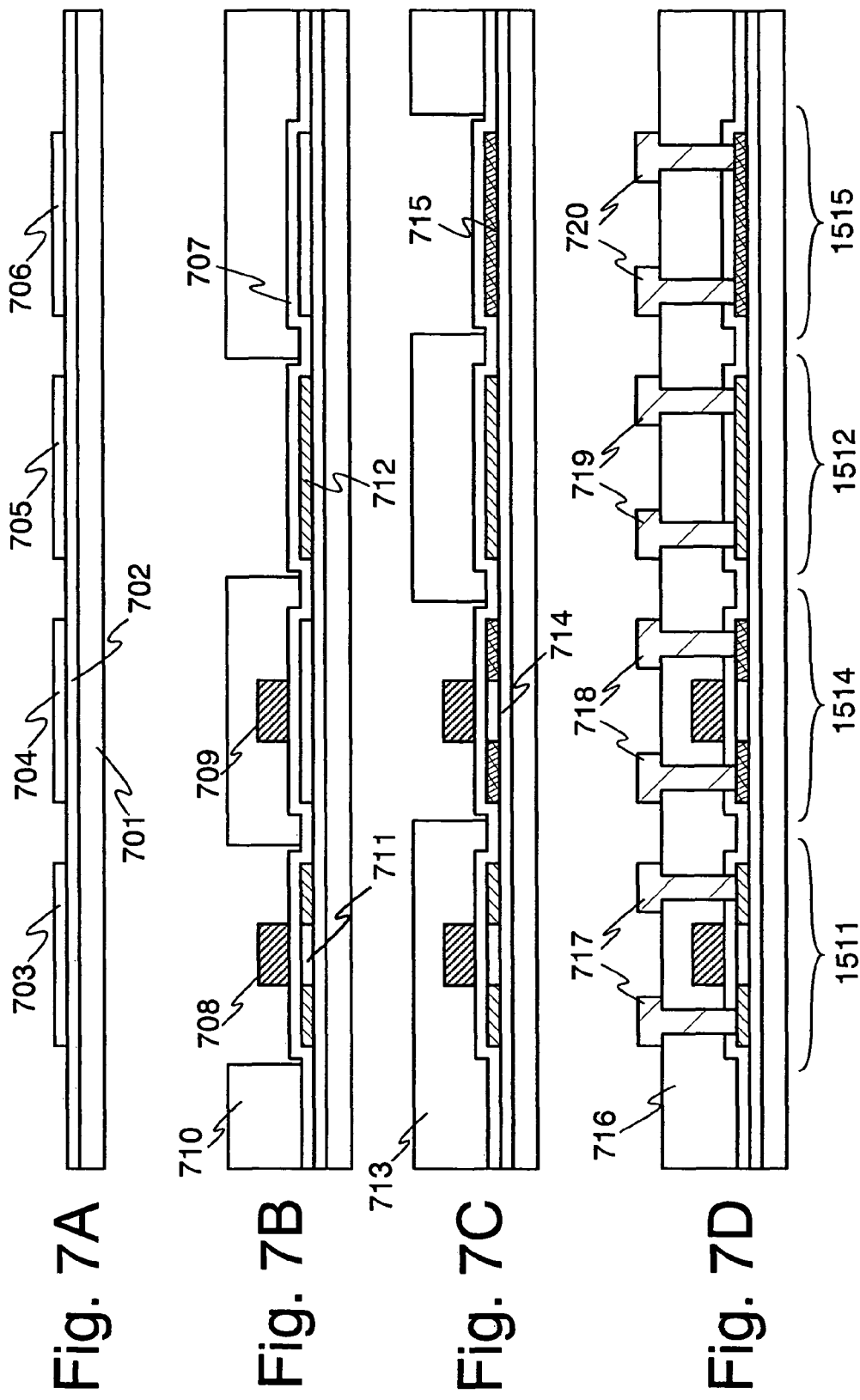
FIGS. 7A to 7D are cross-sectional views for fabricating steps.

A fabricating method of a thin film resistor of the invention will be explained using FIGS. 7A to 7D. A base film 702 is formed on an insulating substrate 701. For this base film, a nitride film or a laminated film of a nitride film and an oxide film is desirably used. An amorphous silicon film is formed next. The amorphous silicon film is crystallized with thermal or laser irradiations, forming a polysilicon film. Then the polysilicon film is patterned to form silicon islands 703 to 706 of desirable shapes. (FIG. 7A)

Next, a gate insulating film 707 is formed and a gate electrode material is formed thereon. The gate electrode material is patterned to form gate electrodes 708 and 709, and after that, N-type impurities are doped using a resist mask for N-type doping 710. A silicon region where the gate electrode is formed thereon becomes a channel region 711 of N-type TFT 1511 since a region under the gate electrode 708 is not doped. On the other hand, a silicon region where no gate electrode is left thereon becomes an N-type thin film resistor 712 since the silicon region is doped. (FIG. 7B) After the resist mask for N-type doping 710 is taking off, a resist mask for P-type doping 713 is formed and P-type impurities are doped. A silicon region where the gate electrode is formed thereon becomes a channel region 714 of P-type TFT 1514 since a region under the gate electrode 709 is not doped. On the other hand, a silicon region where no gate electrode is formed thereon becomes a P-type thin film resistor 715 since the of the silicon region is doped. (FIG. 7C)

Subsequently, an interlayer film 716 is formed and contact holes are opened. Electrodes 717 to 720 are formed by forming and patterning a wiring metal, thus an N-type TFT 1511, a P-type TFT 1514, an N-type thin film resistor 1512, and a P-type thin film resistor 1515 are formed. A circuit is completed with these steps. (FIG. 7D) In addition, top plane views of them are shown in FIGS. 14A to 14D. The same parts are designated by similar numerals. FIGS. 14A to 14D show top plane views of the N-type TFT 1511, the P-type TFT 1514, the N-type thin film resistor 1512, and the P-type thin film resistor 1515. Numerals 708, 709, 711, 712 and 717-720 in FIGS. 14A to 14D are corresponding to same numerals in FIGS. 7A to 7D, and numerals 721 to 724 denote contact holes in the interlayer film denoted by numeral 716 in FIG. 7D. As described above, it is possible to fabricate the thin film resistors without adding anything to forming steps of a TFT in the present embodiment. Note that, although either P-type or N-type impurities may be doped for forming the resistors in the embodiment, a resistor doped with P-type impurity is preferable for the thin film resistor because of its less variations.

Embodiment 6

Figure 10:
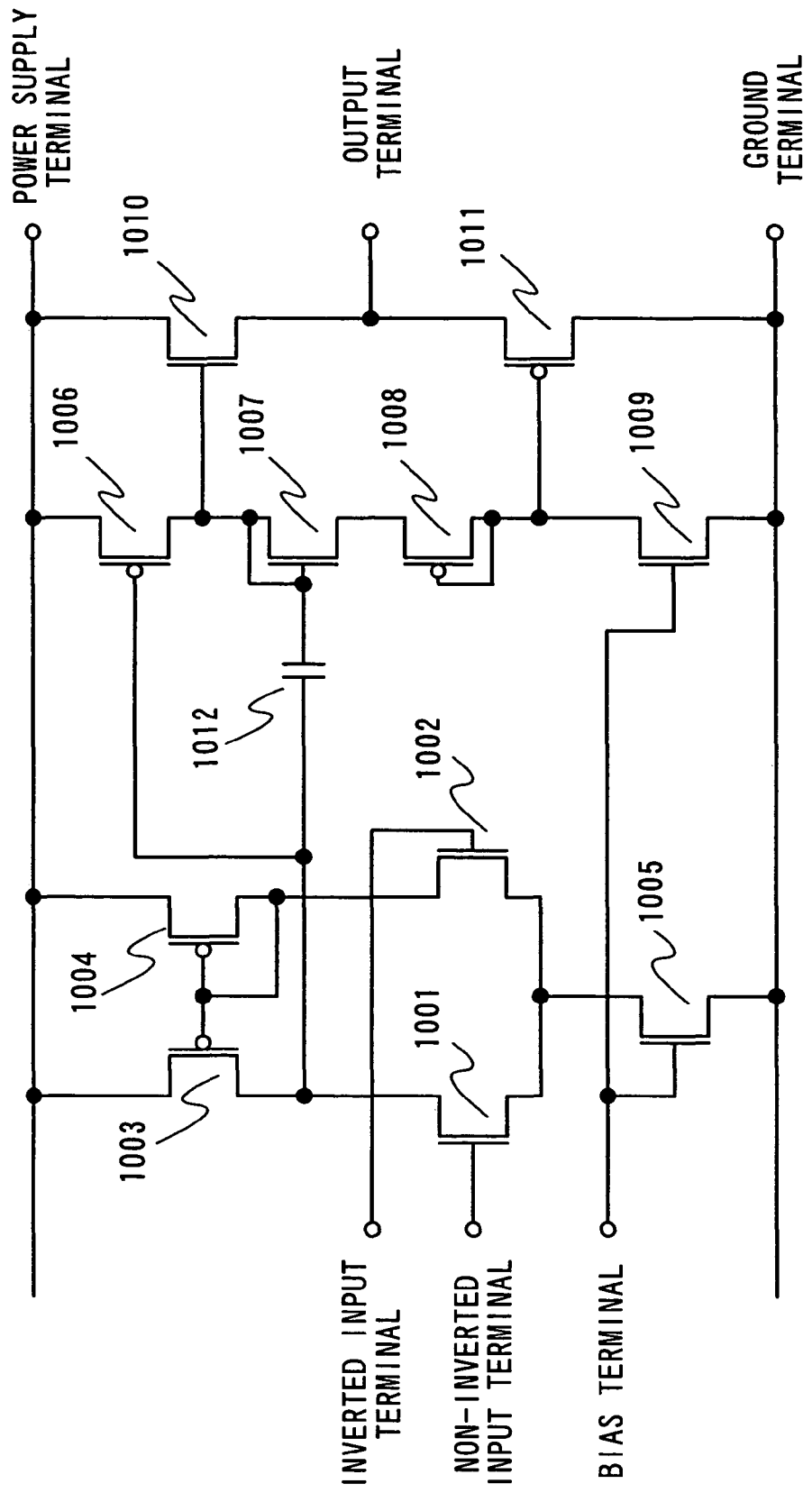
FIG. 10 is an equivalent circuit diagram showing an operational amplifier circuit.

FIG. 10 is an equivalent circuit diagram of an operational amplifier circuit composed of TFTs. This operational amplifier circuit comprises a differential circuit having a TFT 1001 and a TFT 1002, a current mirror circuit having a TFT 1003 and a TFT 1004, a constant current source having a TFT 1005 and a TFT 1009, a common source circuit having a TFT 1006, an idling circuit having a TFT 1007 and a TFT 1008, a source follower circuit having a TFT 1010 and a TFT 1011, and a phase compensation capacitor 1012.

The operation of the operational amplifier circuit shown in FIG. 10 will be explained hereinafter. When a plus signal is input to a non-inverted input terminal, the drain current of the TFT 1001 becomes larger than that of the TFT 1002 since the constant current source having the TFTs 1005 and 1109 is connected to sources of the TFT 1001 and the TFT 1002 which compose the differential circuit. The drain current of the TFT 1003 becomes equal to that of the TFT 1002 since the TFT 1003 and the TFT 1004 compose the current mirror circuit. The differential current between the drain current of the TFT 1003 and that of the TFT 1001 causes the gate voltage of the TFT 1006 to be lowered. The TFT 1006, a P-type TFT, turns on and the drain current increases when the gate voltage of the TFT 1006 is lowered. Therefore, the gate voltage of the TFT 1010 rises. Accompanying with this, the source voltage of the TFT 1010, namely the voltage of an output terminal, rises.

When a minus signal is input to the non-inverted input terminal, the drain current of the TFT 1001 becomes smaller than that of the TFT 1002. Since the drain current of the TFT 1003 is equal to that of the TFT 1002, the differential current between the drain current of the TFT 1003 and that of the TFT 1001 causes the gate voltage of the TFT 1006 to be lowered. The TFT 1006, a P-type TFT, turns off and the drain current decreases when the gate voltage of the TFT 1006 rises. Therefore, the gate voltage of the TFT 1010 lowers. Accompanying with this, the source voltage of the TFT 1010, namely the voltage of the output terminal, is lowered. As described above, a signal having the same phase as that of a signal of the non-inverted input terminal is output from the output terminal.

When a plus signal is input to an inverted input terminal, the drain current of the TFT 1001 becomes smaller than that of the TFT 1002. Since the drain current of the TFT 1003 is equal to that of the TFT 1002, the differential current between the drain current of the TFT 1003 and that of the TFT 1001 causes the gate voltage of the TFT 1006 to be risen. The TFT 1006, a P-type TFT, turns off and the drain current decreases when the gate voltage of the TFT 1006 rises. Therefore, the gate voltage of the TFT 1010 lowers. Accompanying with this, the source voltage of the TFT 1010, namely the voltage of the output terminal, is lowered.

When a minus signal is input to the inverted input terminal, the drain current of the TFT 1001 becomes larger than that of the TFT 1002. Since the drain current of the TFT 1003 is equal to that of the TFT 1002, the differential current between the drain current of the TFT 1003 and that of the TFT 1001 causes the gate voltage of the TFT 1006 to be lowered. The TFT 1006, a P-type TFT, turns on and the drain current increases when the gate voltage of the TFT 1006 is lowered. Therefore, the gate voltage of the TFT 1010 rises. Accompanying with this, the source voltage of the TFT 1010, namely the voltage of the output terminal, is raised. As described above, a signal having the reverse phase to a signal of the inverted input terminal is output from the output terminal.

In this embodiment, the differential circuit is composed of Nch TFTs and the current mirror circuit is composed of Pch TFTs. However, the invention is not limited to this, and vice versa may be used, i.e. the differential circuit may be configured by Pch TFTs and the current mirror circuit may be configured by Nch TFTs. In addition, a circuit is not limited to the circuit described above, another circuit may be used as far as it functions as an operational amplifier circuit.

Embodiment 7

A display device manufactured as described above can be used as a display portion of various electronic equipments. Electronic equipment incorporating a display device which is manufactured according to the invention as a display medium will be explained hereinafter.

Examples of such electronic equipments include a video camera, a digital camera, a head mounted display (a goggle display), a game machine, a car navigation system, a personal computer, a portable information terminal (a mobile computer, a mobile phone or an electronic book) and the like. Specific examples of them are shown in FIGS. 12A to 12G.

Figure 12A:
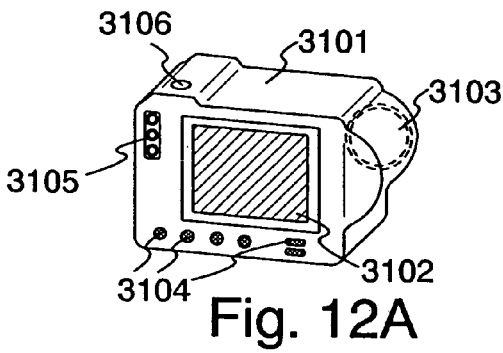
FIGS. 12A to 12G are views of electronic equipments using display devices.

FIG. 12A is a digital camera which includes a main body 3101, a display portion 3102, an image-receiving portion 3103, operation keys 3104, an external connection port 3105, and a shutter 3106 and the like. The display device of the invention can be used in the display portion 3102 to achieve a digital camera that is compact and convenient.

Figure 12B:
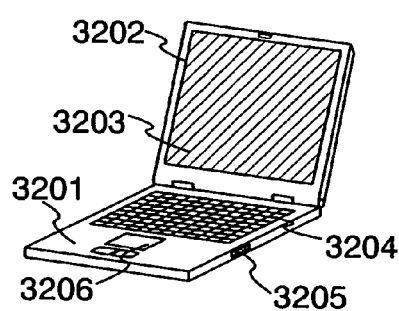

FIG. 12B is a laptop computer which includes a main body 3201, a housing 3202, a display portion 3203, a keyboard 3204, an external connection port 3205, a pointing mouse 3206 and the like. The display device of the invention can be used in the display portion 3203 to achieve a laptop computer that is compact and convenient.

Figure 12C:
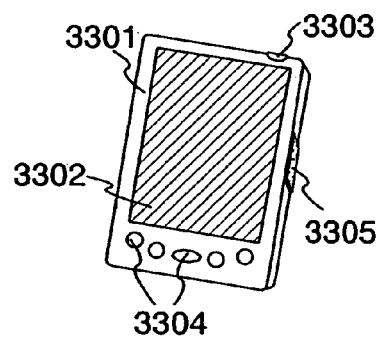

FIG. 12C is a portable information terminal which includes a main body 3301, a display portion 3302, a switch 3303, operation keys 3304, an infrared port 3305 and the like. The display device of the invention can be used in the display portion 3302 to achieve a portable information terminal that is compact and convenient.

Figure 12D:
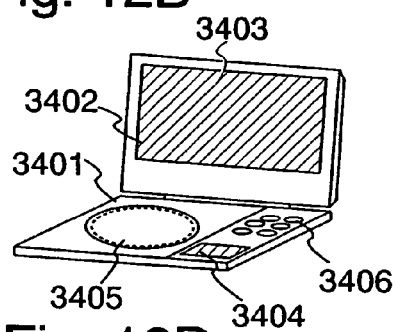

FIG. 12D is an image reproduction device with a recording medium (specifically, a DVD reproduction device) which includes a main body 3401, a housing 3402, a recording medium (such as a CD, an LD or a DVD) read-in portion 3405, operation switches 3406, a display portion A 3403, a display portion B 3404 and the like. The display portion A 3403 mainly displays image data, and the display portion B 3404 mainly displays character data. The display device of the invention can be used in the display portions A 3403 and B 3404 of the image reproduction device provided with the recording medium to achieve an image reproduction device that is compact and convenient. Note that a CD reproduction device, a game machine and the like are included in the image reproduction device with a recording medium.

Figure 12E:
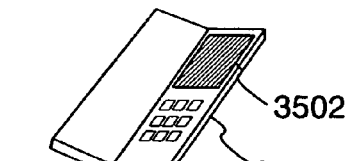

FIG. 12E is a foldaway portable display device. A display portion 3502 using the invention can be attached to a main body 3501 to achieve a portable display device that is compact and convenient.

Figure 12F:
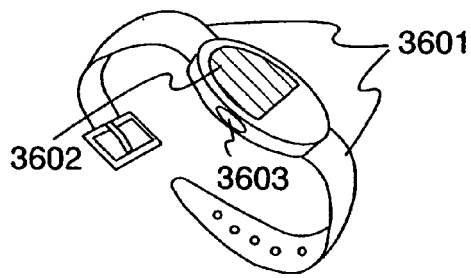

FIG. 12F is a watch which includes a belt 3601, a display portion 3602, an operation switch 3603 and the like. The display device of the invention can be used in the display portion 3602 to achieve a watch that has an audio output function.

Figure 12G:
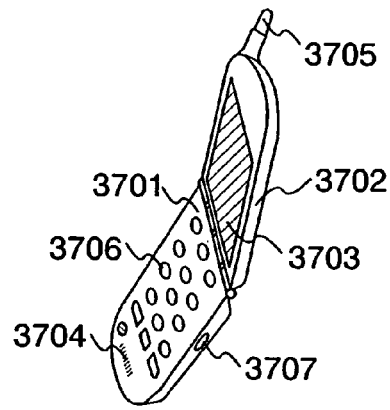

FIG. 12G is a mobile phone which includes a main body 3701, a housing 3702, a display portion 3703, an audio input portion 3704, an antenna 3705, operation keys 3706, an external connection port 3707. The display device of the invention can be used in the display portion 3703 to achieve a mobile phone that is compact and convenient.

As described above, the invention can be used widely, and be applied to electronic equipment of various fields. Note that the electronic equipments of this embodiment can be achieved by using any combination of structures in Embodiments 1 to 6.

What is claimed is:

1. An audio signal processing circuit comprising:
   an operational amplifier formed over an insulating substrate and comprising a thin film element, the operational amplifier including an input terminal and an output terminal;
   a first thin film resistor formed over the insulating substrate, a first terminal of the first thin film resistor being electrically connected to the input terminal of the operational amplifier, and a second terminal of the first thin film resistor being electrically connected to the output terminal of the operational amplifier;
   a second thin film resistor formed over the insulating substrate, a first terminal of the second thin film resistor being electrically connected to the input terminal of the operational amplifier and the first terminal of the first thin film resistor;
   a first chip capacitor mounted over a flexible printed circuit connected to the insulating substrate, the first chip capacitor being electrically connected to a second terminal of the second thin film resistor, and
   a smoothing circuit and the smoothing circuit comprises a third thin film resistor and a second chip capacitor,
   wherein a first terminal of the third thin film resistor is electrically connected to the first thin film resistor, and
   wherein a second terminal of the third thin film resistor is connected to the second chip capacitor.

2. The audio signal processing circuit according to claim 1, wherein P-type impurities are doped in the first thin film resistor and the second thin film resistor.

3. The audio signal processing circuit according to claim 1, wherein the first thin film resistor and the second thin film resistor have a resistance value of 80 kΩ or more.

4. An electronic equipment comprising the audio signal processing circuit according to claim 1, wherein the electronic equipment is one selected from the group consisting of a video camera, a digital camera, a head mounted display, a game machine, a car navigation system, a personal computer and a portable information terminal.

5. The audio signal processing circuit according to claim 1, wherein the audio signal processing circuit comprises an input circuit and the input circuit comprises the second thin film resistor and the first chip capacitor.

6. A display device comprising:
a pixel portion formed over an insulating substrate; and
an audio signal processing circuit, wherein the audio signal processing circuit comprises:
an operational amplifier formed over the insulating substrate and comprising a thin film element, the operational amplifier including an input terminal and an output terminal;
a first thin film resistor formed over the insulating substrate, a first terminal of the first thin film resistor being electrically connected to the input terminal of the operational amplifier, and a second terminal of the first thin film resistor being electrically connected to the output terminal of the operational amplifier;
a second thin film resistor formed over the insulating substrate, a first terminal of the second thin film resistor being electrically connected to the input terminal of the operational amplifier and the first terminal of the first thin film resistor;
a first chip capacitor mounted around the pixel portion and over the insulating substrate, the first chip capacitor being electrically connected to a second terminal of the second thin film resistor, and
a smoothing circuit and the smoothing circuit comprises a third thin film resistor and a second chip capacitor,
wherein a first terminal of the third thin film resistor is electrically connected to the first thin film resistor, and
wherein a second terminal of the third thin film resistor is connected to the second chip capacitor.

7. The display device according to claim 6, wherein P-type impurities are doped in the first thin film resistor and the second thin film resistor.

8. The display device according to claim 6, wherein the first thin film resistor and the second thin film resistor have a resistance value of 80 kΩ or more.

9. An electronic equipment comprising the display device according to claim 6, wherein the electronic equipment is one selected from the group consisting of a video camera, a digital camera, a head mounted display, a game machine, a car navigation system, a personal computer and a portable information terminal.

10. The display device according to claim 6, wherein the display device comprises an input circuit and the input circuit comprises the second thin film resistor and the first chip capacitor.

11. A display device comprising:
a pixel portion formed over an insulating substrate; and
an audio signal processing circuit, wherein the audio signal processing circuit comprises:
an operational amplifier formed over the insulating substrate and comprising a thin film element, the operational amplifier including an input terminal and an output terminal;
a first thin film resistor formed over the insulating substrate, a first terminal of the first thin film resistor being electrically connected to the input terminal of the operational amplifier, and a second terminal of the first thin film resistor being electrically connected to the output terminal of the operational amplifier;
a second thin film resistor formed over the insulating substrate, a first terminal of the second thin film resistor being electrically connected to the input terminal of the operational amplifier and the first terminal of the first thin film resistor;
a first chip capacitor mounted over a flexible printed circuit connected to the insulating substrate, the first chip capacitor being electrically connected to a second terminal of the second thin film resistor, and
a smoothing circuit and the smoothing circuit comprises a third thin film resistor and a second chip capacitor,
wherein a first terminal of the third thin film resistor is electrically connected to the first thin film resistor, and
wherein a second terminal of the third thin film resistor is connected to the second chip capacitor.

12. The display device according to claim 11, wherein P-type impurities are doped in the first thin film resistor and the second thin film resistor.

13. The display device according to claim 11, wherein the first thin film resistor and the second thin film resistor have a resistance value of 80 kΩ or more.

14. An electronic equipment comprising the display device according to claim 11, wherein the electronic equipment is one selected from the group consisting of a video camera, a digital camera, a head mounted display, a game machine, a car navigation system, a personal computer and a portable information terminal.

15. The display device according to claim 11, wherein the display device comprises an input circuit and the input circuit comprises the second thin film resistor and the first chip capacitor.

16. An audio signal processing circuit comprising:
an operational amplifier formed over an insulating substrate and comprising a thin film element, the operational amplifier including an input terminal and an output terminal;
a first thin film resistor formed over the insulating substrate, a first terminal of the first thin film resistor being electrically connected to the input terminal of the operational amplifier, and a second terminal of the first thin film resistor being electrically connected to the output terminal of the operational amplifier;
a second thin film resistor formed over the insulating substrate, a first terminal of the second thin film resistor being electrically connected to the input terminal of the operational amplifier and the first terminal of the first thin film resistor;
a first chip capacitor mounted over the insulating substrate, the first chip capacitor being electrically connected to a second terminal of the second thin film resistor, and
a smoothing circuit and the smoothing circuit comprises a third thin film resistor and a second chip capacitor,
wherein a first terminal of the third thin film resistor is electrically connected to the first thin film resistor, and
wherein a second terminal of the third thin film resistor is connected to the second chip capacitor.

17. The audio signal processing circuit according to claim 16, wherein the audio signal processing circuit comprises an input circuit and the input circuit comprises the second thin film resistor and the first chip capacitor.

18. The audio signal processing circuit according to claim 16, wherein P-type impurities are doped in the first thin film resistor and the second thin film resistor.

19. The audio signal processing circuit according to claim 16, wherein the first thin film resistor and the second thin film resistor have a resistance value of 80 kΩ or more.

20. An electronic equipment comprising the audio signal processing circuit according to claim 16, wherein the electronic equipment is one selected from the group consisting of a video camera, a digital camera, a head mounted display, a game machine, a car navigation system, a personal computer and a portable information terminal.

21. An audio signal processing circuit comprising:
an operational amplifier formed over an insulating substrate and comprising a thin film element, the operational amplifier including an input terminal and an output terminal;
a first thin film resistor formed over the insulating substrate, a first terminal of the first thin film resistor being electrically connected to the input terminal of the operational amplifier, and a second terminal of the first thin film resistor being electrically connected to the output terminal of the operational amplifier;
a second thin film resistor formed over the insulating substrate, a first terminal of the second thin film resistor being electrically connected to the input terminal of the operational amplifier and the first terminal of the first thin film resistor;
a first chip capacitor mounted over a printed circuit board electrically connected to the insulating substrate, the first chip capacitor being electrically connected to a second terminal of the second thin film resistor, and
a smoothing circuit and the smoothing circuit comprises a third thin film resistor and a second chip capacitor,
wherein a first terminal of the third thin film resistor is electrically connected to the first thin film resistor, and
wherein a second terminal of the third thin film resistor is connected to the second chip capacitor.

22. The audio signal processing circuit according to claim 21, wherein the audio signal processing circuit comprises an input circuit and the input circuit comprises the second thin film resistor and the first chip capacitor.

23. The audio signal processing circuit according to claim 21, wherein P-type impurities are doped in the first thin film resistor and the second thin film resistor.

24. The audio signal processing circuit according to claim 21, wherein the first thin film resistor and the second thin film resistor have a resistance value of 80 kΩ or more.

25. An electronic equipment comprising the audio signal processing circuit according to claim 21, wherein the electronic equipment is one selected from the group consisting of a video camera, a digital camera, a head mounted display, a game machine, a car navigation system, a personal computer and a portable information terminal.

26. A display device comprising:
a pixel portion formed over an insulating substrate; and
an audio signal processing circuit, wherein the audio signal processing circuit comprises:
an operational amplifier formed over the insulating substrate and comprising a thin film element, the operational amplifier including an input terminal and an output terminal;
a first thin film resistor formed over the insulating substrate, a first terminal of the first thin film resistor being electrically connected to the input terminal of the operational amplifier, and a second terminal of the first thin film resistor being electrically connected to the output terminal of the operational amplifier;
a second thin film resistor formed over the insulating substrate, a first terminal of the second thin film resistor being electrically connected to the input terminal of the operational amplifier and the first terminal of the first thin film resistor;
a first chip capacitor mounted over a printed circuit board electrically connected to the insulating substrate, the first chip capacitor being electrically connected to a second terminal of the second thin film resistor, and
a smoothing circuit and the smoothing circuit comprises a third thin film resistor and a second chip capacitor,
wherein a first terminal of the third thin film resistor is electrically connected to the first thin film resistor, and
wherein a second terminal of the third thin film resistor is connected to the second chip capacitor.

27. The display device according to claim 26, wherein the display device comprises an input circuit and the input circuit comprises the second thin film resistor and the first chip capacitor.

28. The display device according to claim 26, wherein P-type impurities are doped in the first thin film resistor and the second thin film resistor.

29. The display device according to claim 26, wherein the first thin film resistor and the second thin film resistor have a resistance value of 80 kΩ or more.

30. An electronic equipment comprising the display device according to claim 26, wherein the electronic equipment is one selected from the group consisting of a video camera, a digital camera, a head mounted display, a game machine, a car navigation system, a personal computer and a portable information terminal.

* * * * *